(12) United States Patent
Nakajima

(10) Patent No.: US 6,727,129 B1
(45) Date of Patent: Apr. 27, 2004

(54) METHOD FOR MANUFACTURING A SEMICONDUCTOR DEVICE

(75) Inventor: Kazuaki Nakajima, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/390,617

(22) Filed: Mar. 19, 2003

(30) Foreign Application Priority Data

Oct. 30, 2002 (JP) ........................................ 2002-316349

(51) Int. Cl.[7] ........................................ H01L 21/8234
(52) U.S. Cl. ........................ 438/197; 438/199; 438/275
(58) Field of Search ........................ 438/197, 199, 438/230, 231, 585, 592

(56) References Cited

U.S. PATENT DOCUMENTS

| | | | | |
|---|---|---|---|---|
| 3,883,410 A | * | 5/1975 | Inoue | 205/662 |
| 4,115,960 A | * | 9/1978 | Zecher | 451/32 |
| 4,968,397 A | * | 11/1990 | Asher et al. | 205/710 |
| 5,733,799 A | * | 3/1998 | Teruyama | 438/127 |
| 5,753,096 A | * | 5/1998 | Zecher | 205/145 |
| 6,165,819 A | * | 12/2000 | Seki et al. | 438/123 |
| 6,376,888 B1 | | 4/2002 | Tsunashima et al. | |
| 6,424,024 B1 | * | 7/2002 | Shih et al. | 257/667 |

FOREIGN PATENT DOCUMENTS

| | | |
|---|---|---|
| JP | 8-130216 | 5/1996 |
| JP | 8-153804 | 6/1996 |
| JP | 9-246206 | 9/1997 |
| JP | 10-125919 | 5/1998 |

\* cited by examiner

*Primary Examiner*—Michael Trinh
(74) *Attorney, Agent, or Firm*—Finnegan, Henderson, Farabow, Garrett & Dunner, L.L.P.

(57) ABSTRACT

A method for manufacturing a semiconductor device having an n-type MIS transistor and a p-type MIS transistor comprises forming a first gate insulating film in a first area where the n-type MIS transistor is to be formed, depositing a first conductive film on the first gate insulating film in the first area, the first conductive film containing silicon, a metal element selected from tungsten and molybdenum and an impurity element selected from phosphorus and arsenic, forming a second gate insulating film in a second area where the p-type MIS transistor is to be formed, and forming a second conductive film on the second gate insulating film in the second area, the second conductive film having a work function higher than that of the first conductive film.

11 Claims, 9 Drawing Sheets

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2002-316349, filed Oct. 30, 2002, the entire contents of which are incorporated herein by reference.

BACKGROUND OF THE INVENTION

1. Field of the Invention

The present invention relates to a method for manufacturing a semiconductor device and in particular to the technique of forming a gate electrode in a semiconductor device having an n-type MIS transistor and a p-type MIS transistor.

2. Description of the Related Art

In recent years, a greater demand has been made for a high-speed, high integration density semiconductor device. In order to realize such a demand, studies have been made on not only the reduction of the element dimension and element-to-element interval dimension but also the achieving of electrodes and wirings of lower resistance. In order to achieve such lower resistance, a policide structure has been widely used in which a metal silicide is stacked on a polycrystalline silicon. With the microminiaturization of the semiconductor devices it has been necessary to secure a unit of a still lower resistance.

Under such a situation, a metal gate electrode structure now provides a promising candidate in which a metal film is directly formed on a gate insulating film. In such metal gate electrode structure, however, a new problem arises upon comparison with the polycide structure, etc., in which a polycrystalline silicon is set in contact with the gate insulating film. In the polycide structure, etc., the threshold voltage of a transistor is determined depending upon the impurity concentration of a channel region and the concentration of an impurity in the polycrystalline silicon. In contrast, in the metal gate electrode structure, the threshold voltage of the transistor is determined depending upon the impurity concentration of the channel region and work function of the metal gate electrode. It is, therefore, necessary to adopt a so-called dual metal gate electrode structure using two kinds of gate electrode materials of different work functions for n-type MIS transistor and p-type MIS transistor.

In the dual metal gate electrode structure, it is necessary to use, for the gate electrode of the n-type MIS transistor, a material having a work function φm of not higher than 4.6 eV or desirably not higher than 4.3 eV. As the material of such a lower work function, Ta and Nb are known. Since Ta and Nb reveal a high reaction with an underlying insulating film, it is difficult to use Ta and Nb as the gate electrode material. Further, a tungsten silicide ($WSi_x$) reveals an excellent thermal stability but the work function φm is of the order of 4.4 eV and it is hardly said that this material is optimal as the gate electrode material of the n-type MIS transistor.

As the prior art, Jpn. Pat. Appln. KOKAI Publication Nos. 8-130216, 8-153804 and 9-246206 disclose the techniques of implanting an impurity ion into a tungsten silicide ($WSi_x$) film from the viewpoint of controlling the work function of the gate electrode. Further, Jpn. Pat. Appln. KOKAI Publication No. 10-125919 discloses the technique of implanting an impurity ion into a tungsten silicide film followed by an annealing process.

In these Publications, however, the techniques comprise implanting an impurity ion into the tungsten silicide and problems arise, such as the lowering of a reliability of the gate insulating film, etc., resulting from a damage caused by the ion implantation as well as the difficulty encountered in controlling an impurity concentration distribution in the gate electrode.

As described above, from the standpoint of achieving an electrode and wiring of lower resistance a metal gate electrode structure is proposed. And from the standpoint of controlling the work function of the gate electrode a proposal is made to implant an impurity into the metal silicide film. In the prior art technique, however, since an impurity ion is implanted, the reliability is lowered due to a damage caused by the ion implanation and it is difficult to control the impurity concentration distribution. It is, therefore, difficult to optimize the work function of the gate electrode and to obtain a semiconductor device excellent in its characteristics and its reliability.

BRIEF SUMMARY OF THE INVENTION

According to an aspect of the invention, there is provided a method for manufacturing a semiconductor device having an n-type MIS transistor and a p-type MIS transistor, comprising: forming a first gate insulating film in a first area where the n-type MIS transistor is to be formed; depositing a first conductive film on the first gate insulating film in the first area, the first conductive film containing silicon, a metal element selected from tungsten and molybdenum and an impurity element selected from phosphorus and arsenic; forming a second gate insulating film in a second area where the p-type MIS transistor is to be formed; and forming a second conductive film on the second gate insulating film in the second area, the second conductive film having a work function higher than that of the first conductive film.

DETAILED DESCRIPTION OF THE INVENTION

Figure 1A:
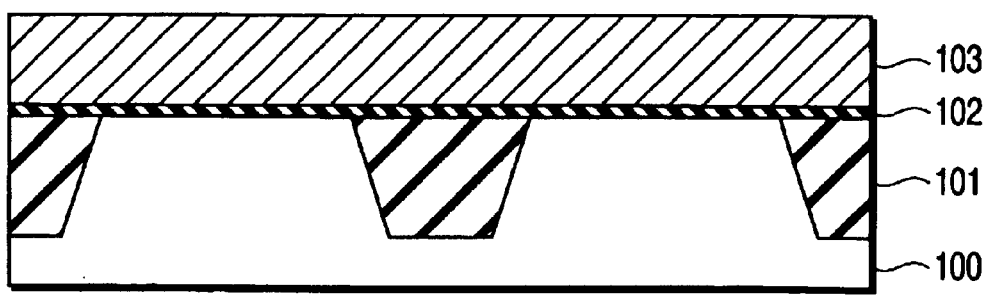
FIGS. 1A to 1I are cross-sectional views showing a model of a manufacturing method of a semiconductor device according to a first embodiment of the present invention.

The embodiments of the present invention will be explained below with reference to the drawing.

First Embodiment FIGS. 1A to 1I are cross-sectional views showing a model of the manufacturing method of a semiconductor device according to a first embodiment of the present invention.

As shown in FIG. 1A, a silicon oxide film 102 is formed on a single crystal silicon substrate (semiconductor substrate) 100 having an isolation region 101. Then a polycrystalline silicon film 103 is deposited on the silicon oxide film 102.

Figure 1B:
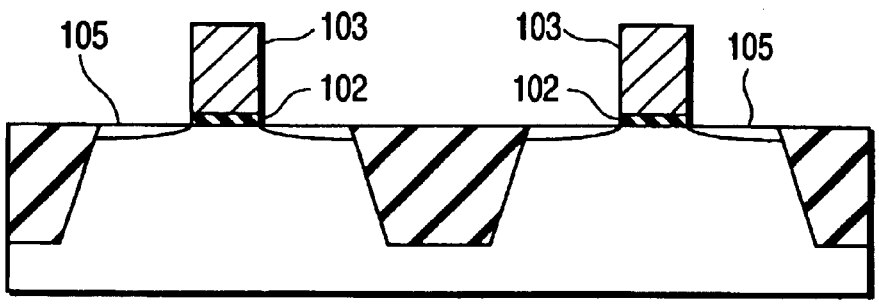

Then, as shown in FIG. 1B, the polycrystalline silicon film 103 is subjected to anisotropic etching to provide a dummy gate. Then, As+ ions are implanted into an n-type MIS transistor formation region (hereinafter referred to as an nMOS area) and B+ ions are implanted into a p-type MIS transistor formation region (hereinafter referred to as a pMOS area). The resultant structure is heat treated for five seconds at 1000° C. to provide diffusion layers 105 serving as the portions of source/drain regions.

Figure 1C:
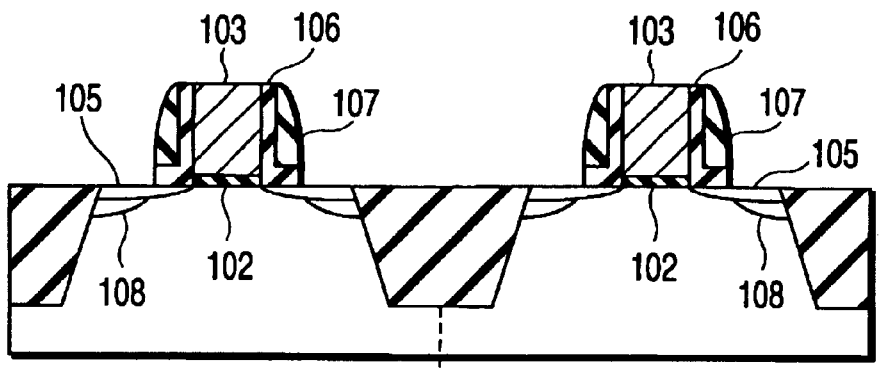

Then, as shown in FIG. 1C, a silicon nitride film 106 and a silicon oxide film 107 are deposited on a whole surface. After this, an etch-back process is done there to selectively leave the silicon nitride film 106 and silicon oxide film 107 on the sidewall of the dummy electrode. Then P+ ions are implanted into the nMOS area and B+ ions are implanted into the pMOS area. The resultant structure is heat treated for 10 seconds at 950° C. to provide diffusion layers 108 serving as the portions of the source/drain regions.

Figure 1D:
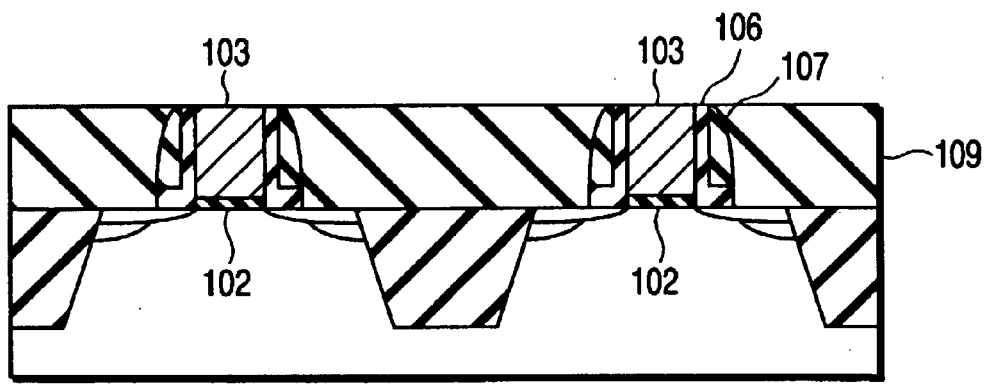

Then, as shown in FIG. 1D, an interlayer insulating film 109 is formed on a whole surface. After this, the interlayer insulating film 109 is planarized by a chemical mechanical polishing (CMP) to expose the surface of the polycrystalline silicon film 103.

Figure 1E:
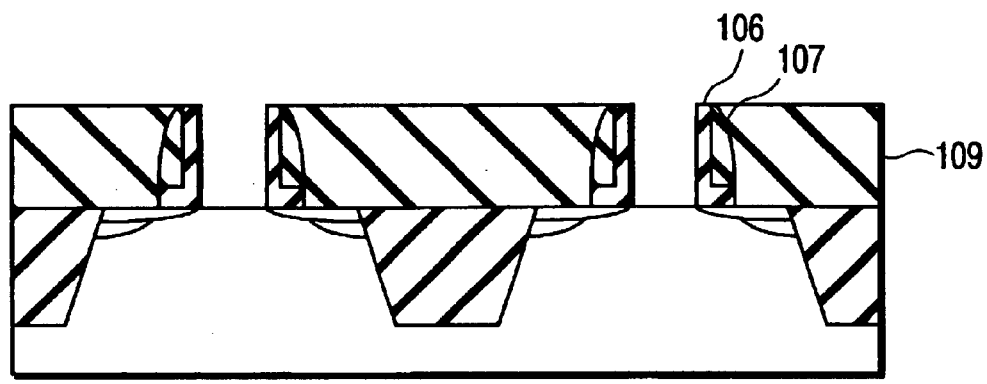

Then, as shown in FIG. 1E, the polycrystalline silicon film 103 is removed and further the silicon oxide film 102 is also removed to form a groove surrounded with the silicon substrate 100 and silicon nitride film 106.

Figure 1F:
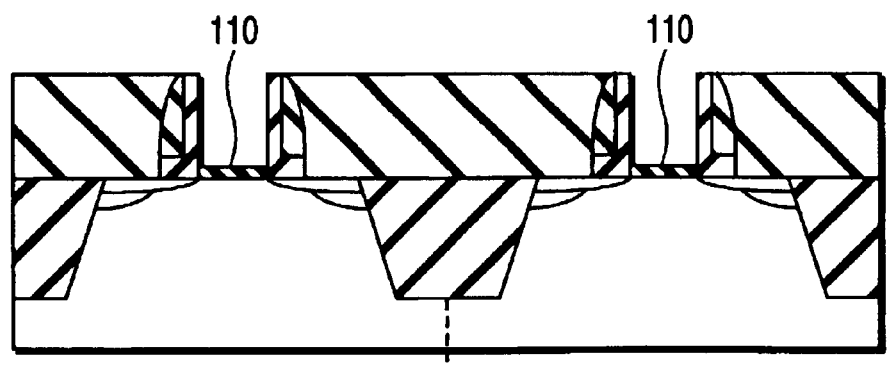

Then, as shown in FIG. 1F, a thin silicon oxynitride film is formed as a gate insulating film 110 on the bottom of the groove by a plasma oxynitriding method.

Figure 1G:
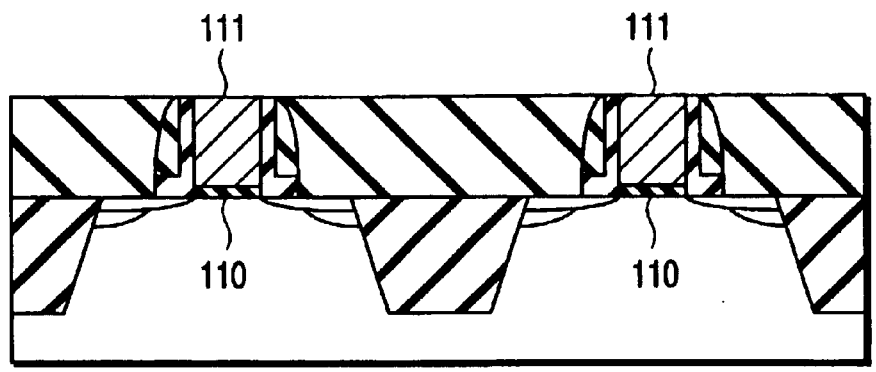

Then, as shown in FIG. 1G, a phosphorus (P) containing tungsten silicide film (hereinafter referred to as a WSiP film) 111 is deposited as a first conductive film on a whole surface by a CVD method. As a source gas use is made of, for example, $W(CO)_6$, $SiH_4$ and $PH_3$. By using the phosphorus containing W silicide film it is possible to make the work function lower than that of a silicide film containing no phosphorus. Then the WSiP film 111 is planarized by the CMP method to expose the surface of the interlayer insulating film 109.

Figure 1H:
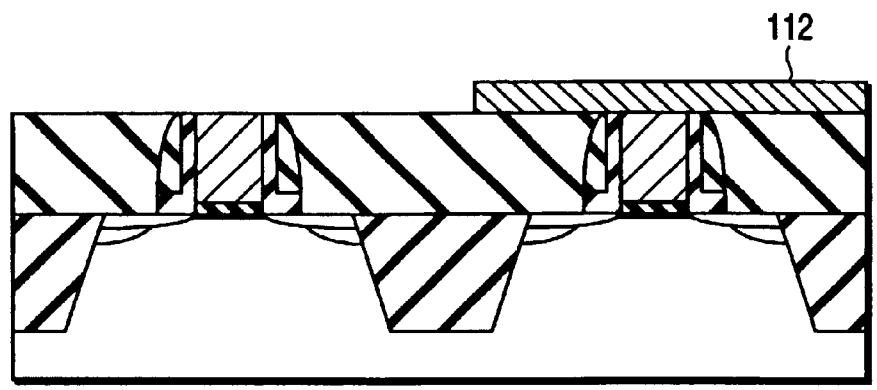

Then, as shown in FIG. 1H, a Pt film 112 is deposited as a metal film on a whole surface. And the Pt film 112 is removed by etching at an area other than the pMOS area.

Figure 1I:
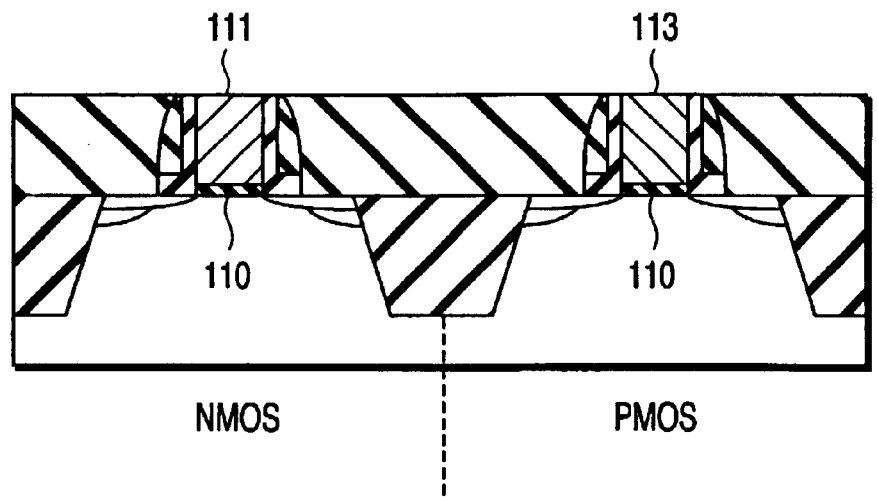

Then, as shown in FIG. 1I, a reaction between the Pt film 112 and the WSiP film 111 is done under a heat treatment. By this heat treatment, Si in the WSiP film 111 reacts with the Pt film 112 to provide a Pt silicide film. With the formation of the Pt silicide, Si in the WSiP film is decreased. And Pt is extracted at an interface between the gate insulating film 110 and the WSiP film. As a result, a film (second conductive film) 113 containing Pt, which is higher in work function than the WSiP film 111, is provided in the groove of the pMOS transistor.

By doing so, a CMOS transistor can be obtained in which the WSiP film of a lower work function is used for the gate electrode of the nMOS transistor and the electrode film higher in work function than the WSiP film is used for the gate electrode of the pMOS transistor.

According to the present embodiment, as set out above, the P containing W silicide film (WSiP film) is used as the gate electrode of the n-type MIS transistor and, by doing so, it is possible to lower the work function of the gate electrode of the n-type MIS transistor and hence to obtain a gate electrode suited to the n-type MIS transistor. Further, since the WSiP film is formed by a deposition method such as CVD, it is not necessary to introduce an impurity into the silicide film, by the ion implantation method, as in the prior art. It is, therefore, possible to lower damage to the gate insulating film and to make the impurity concentration distribution of the gate electrode uniform. By doing so it is possible to obtain a semiconductor device excellent in its characteristics and reliability. Further, the gate electrode of the p-type MIS transistor is formed through the utilization of the reaction between the Pt film and the WSiP film and any damage to the gate insulating film can be decreased even for the p-type MIS transistor.

Although, in the above-mentioned embodiment, the reaction is carried out between the Pt film (metal film) and the WSiP film, it is possible to use, as a metal film, a metal having a work function of not lower than 4.8 eV suitable for the gate electrode of the pMOS transistor. Stated in more detail, use can be made of a metal film containing at least one of Pt, Pd, Ni, Co, W, Mo, Sb and Bi.

Figure 4:
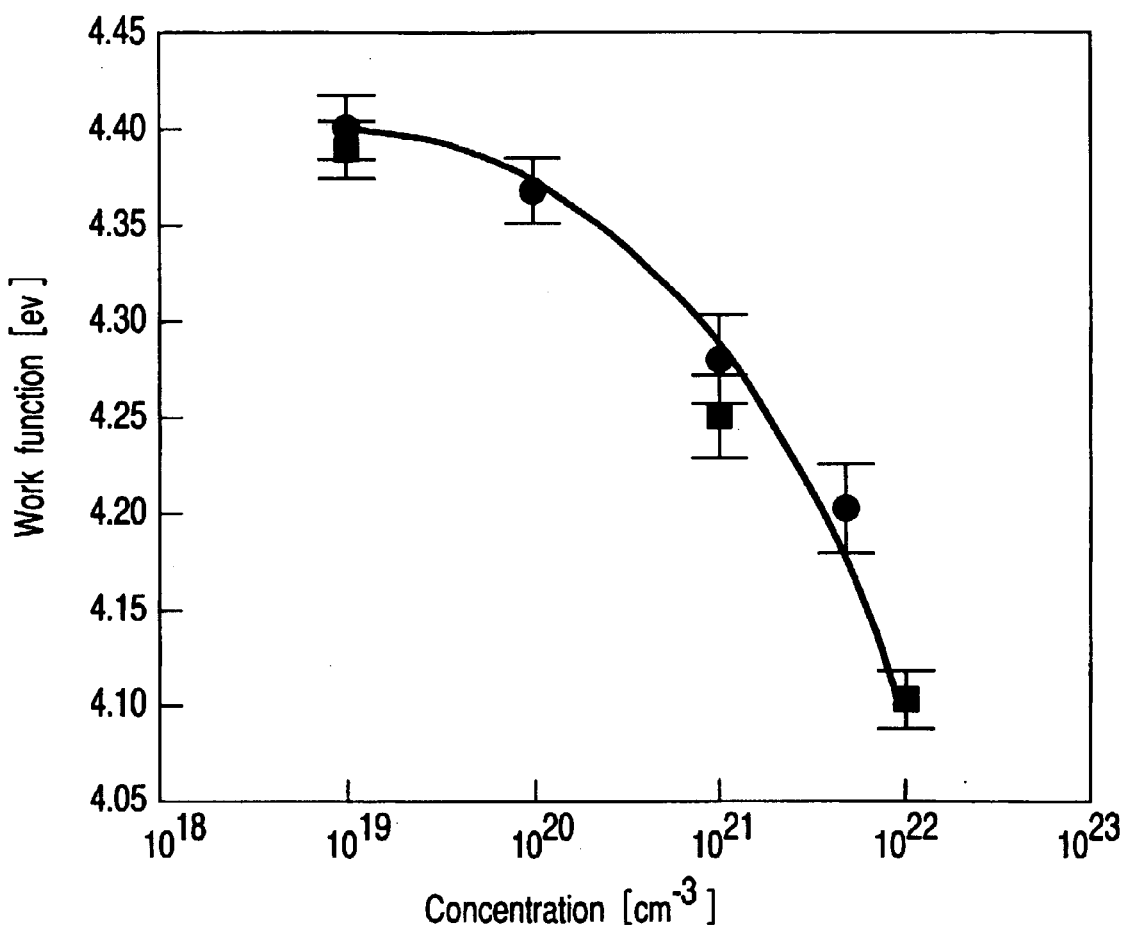
FIG. 4 shows a relation of an impurity concentration to a work function in the embodiment of the present invention.

FIG. 4 shows a relation between the concentration of the impurity element (P) in the WSiP film and the work function as indicated by circle marks in Figure. This relation is obtained by manufacturing an MIS capacitor as shown in FIG. 5 and measuring the C-V characteristics.

The MIS capacitor shown in FIG. 5 was manufactured as will be set out below. First, a silicon oxide film was formed as a gate insulating film 12 on a single crystal silicon substrate 10 having an isolation region. Then a phosphorus containing tungsten silicide film (WSiP film) 13 was deposited by the CVD method on the silicon oxide film 12. At this step, the P concentration in the WSiP film 13 was varied by controlling a flow rate of a $PH_3$ gas. After this, the WSiP film 13 was anisotropically etched to provide a gate electrode. In this way, an MIS capacitor was manufactured as shown in FIG. 5.

As seen from FIG. 4, the work function of the WSiP film is about 4.4 eV when the P concentration in the WSiP film is about $1 \times 10^{19}$ $cm^3$, which is almost equal to the work function of the WSi film (WSi film having no impurity). As the P concentration in the WSiP film 13 becomes higher than about $1 \times 10^{20}$ $cm^3$, the work function starts to rapidly fall. Further, when the P concentration in the WSiP film 13 becomes higher than $1 \times 10^{21}/cm^3$, the work function becomes lower than 4.3 eV and a desirable value is obtained as the work function of the gate electrode of the nMOS transistor.

Figure 5:
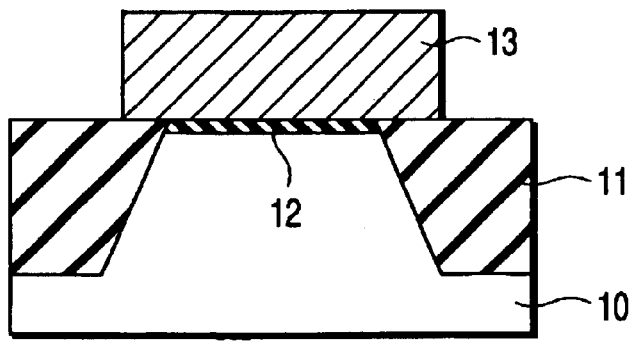
FIG. 5 is a view showing a model of an MIS capacitor used in finding the relation shown in FIG. 4 in connection with the embodiment of the present invention.

Even in the case of using an As containing tungsten silicide film (WSiAs film) in place of the WSiP film, an MIS capacitor was manufactured as in the case of FIG. 5 and an examination was made about the relation between the concentration of an impurity element (As) in the WSiAs film and the work function. This result was indicated by square marks in FIG. 4. As seen from FIG. 4, the same tendency as that of the WSiP film was obtained even for the WSiAs film.

Therefore, the concentration of the impurity element in the WSiP film or the WSiAs film is preferably higher than $1 \times 10^{20}/cm^3$ and more preferably higher than $1 \times 10^{21}/cm^3$. In this connection it is to be noted that the upper limit of the concentration in the impurity element is about $1 \times 10^{22}/cm^3$.

Although, in the above-mentioned embodiment, $W(CO)_6$, $SiH_4$ and $PH_3$ are used as a source gas (film forming gas) for the WSiP film, $WF_6$ or $WCl_6$ can be used as a source gas for W; $SiH_2Cl_2$, $SiCl_4$ or $SiF_4$ can be used as a source gas of Si; and $PF_3$, $PCl_3$, $PClF_2$ or $PBr_3$ can be used as a source gas for P.

Further, for the WSiAs film it is possible to use the same source gas as that for W and that for Si as in the case of the WSiP film and to use $AsH_3$, $AsCl_3$ or $AsF_3$, etc., as the source gas for As.

Further, although, in the above-mentioned embodiment, the P- or the As- containing tungsten silicide film is explained, it is possible to use a P- or As- containing molybednum silide film (MoSiP or MoSiAs film). Even in this case it is possible to obtain the same result as in FIG. 4. For the case of the MoSiP film and MoSiAs film use can be made, as a source gas for Mo, of $Mo(Co)_6$, $MoF_6$ or $MoCl_6$. For the source gas for Si, the source gas for P and the source gas for As, the same gas as set out in connection with the above-mentioned WSiP film and WSiAs film can be applied.

Second Embodiment

FIGS. 2A to 2H are cross-sectional views showing a model of the manufacturing method of a semiconductor device according to the second embodiment of the present invention.

Figure 2A:
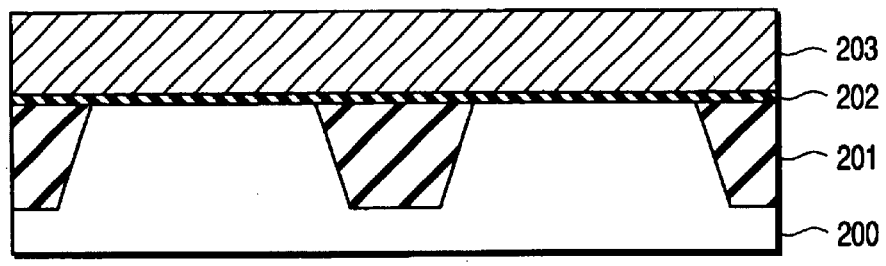
FIGS. 2A to 2H are cross-sectional views showing a model of a manufacturing method of a semiconductor device according to a second embodiment of the present invention.

First, as shown in FIG. 2A, a silicon oxide film is formed as a gate insulating film 202 of an nMOS transistor on a single crystal silicon substrate (semiconductor substrate) 200 having an isolation region 201. Then an As (arsenic) containing tungsten silicide film (hereinafter referred to as a WSiAs film) 203 is deposited as a first conductive film on the silicon oxide film 202 by the CVD method. As a source gas use is made of, for example, $W(CO)_6$, $SiH_4$ and $AsH_3$. By having As contained in the W silicide film it is possible to make the work function lower than that of the W silicide film containing no As.

Figure 2B:
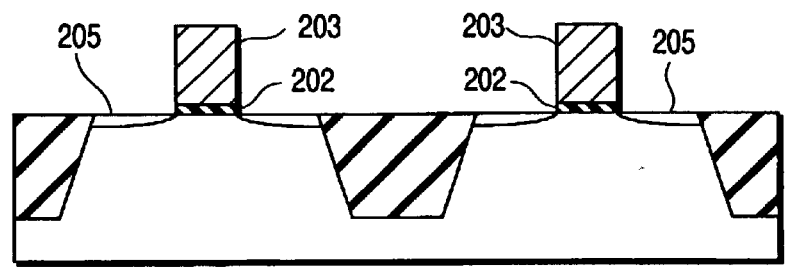

Then, as shown in FIG. 2B, the WSiAs film 203 is anisotropically etched to provide a gate electrode. Then As+ ions are implanted into an n-type MIS transistor formation area (nMOS area) and B+ ions are implanted into a p-type MIS transistor formation area (pMOS area). The resultant structure is heat treated for five seconds at 1000° C. to provide diffusion layers 205 serving as the portions of the source/drain regions.

Figure 2C:
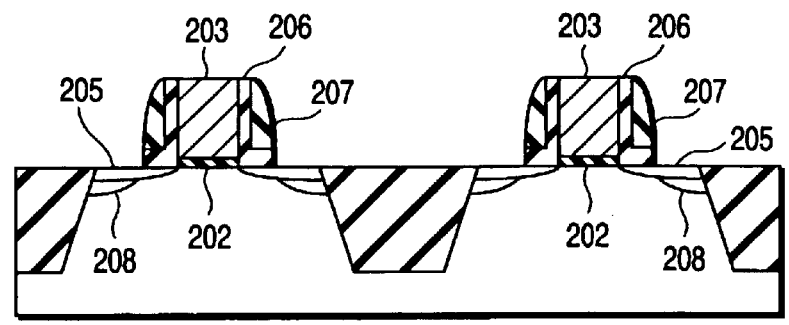

Then, as shown in FIG. 2C, a silicon nitride film 206 and silicon oxide film 207 are deposited on a whole surface. After this, an etch-back process is done to selectively leave the silicon nitride film 206 and silicon oxide film 207 on the sidewall of the gate electrode. Then p+ ions are implanted into the nMOS area and B+ ions are implanted into a pMOS area. The resultant structure is heat treated for 10 seconds at 950° C. to provide diffusion layers 208 serving as the portions of the source/drain regions.

Figure 2D:
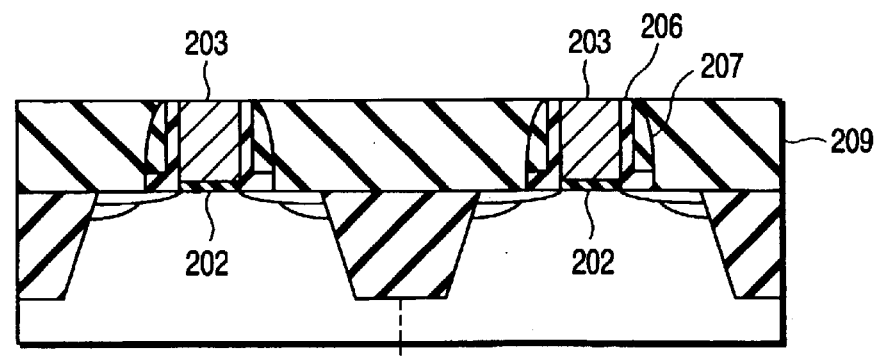

Then, as shown in FIG. 2D, an interlayer insulating film 209 is deposited on a whole surface. Then the interlayer insulating film 209 is planarized by the chemical mechanical polishing to expose the surface of the WSiAs film 203.

Figure 2E:
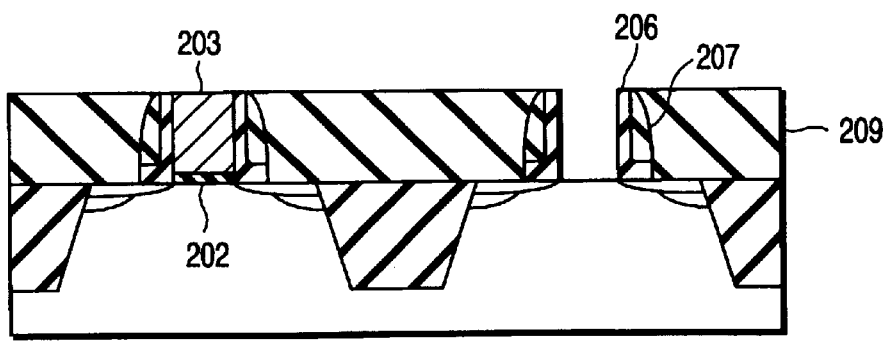

Then, as shown in FIG. 2E, the WSiAs film 203 in the pMOS area is removed and, further, the silicon oxide film 202 is also removed to form a groove surrounded with the silicon substrate 200 and silicon nitride film 206.

Figure 2F:
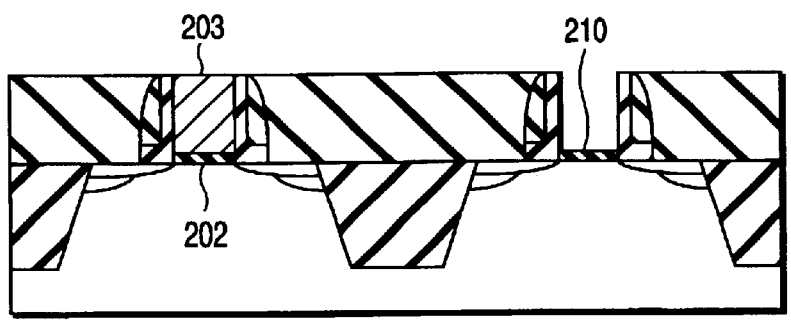

Then, as shown in FIG. 2F, a thin silicon oxide film is formed as a gate insulating film 210 of the pMOS transistor on the bottom of the groove by a thermal oxidation method.

Figure 2G:
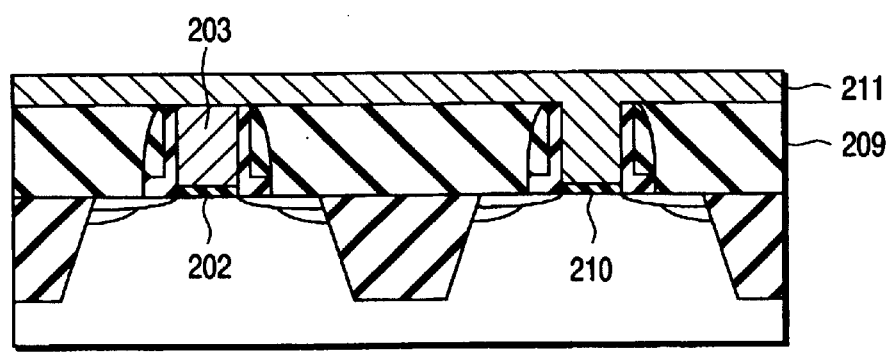
Figure 2H:
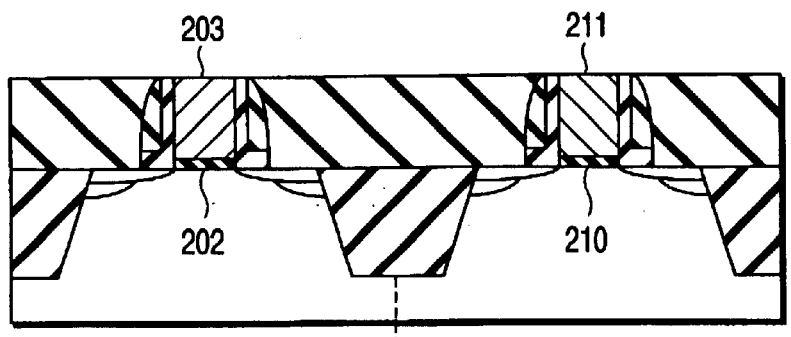

Then, as shown in FIG. 2G, a W film 211 is deposited as a second conductive film on a whole surface. Then, as shown in FIG. 2H, the W film 211 is planarized by the CMP method to expose the surface of the interlayer insulating film 209. Since the work function of W is as high as about 4.9 eV, it is desirable as the electrode material of the pMOS transistor.

By doing so it is possible to obtain a CMOS transistor using a WSiAs film of a lower work function for the gate electrode of the nMOS transistor and, for the gate electrode of the pMOS transistor, an electrode film of a higher work function than the WSiAs film.

According to the present embodiment, as set out above, the W silicide film (WSiP film) containing As is used as the gate electrode of the n-type MIS transistor and it is possible to lower the work function of the gate electrode of the n-type MIS transistor and hence to obtain a gate electrode suited to the n-type MIS transistor. Further, since the WSiAs film is formed by the deposition method such as a CVD, it is not necessary to introduce an impurity, by an ion implantation method, into the silicide film as in the prior art. As a result, it is possible to decrease a damage to the gate insulating film and to make an impurity concentration distribution of the gate electrode uniform and it is, therefore, possible to obtain a semiconductor device excellent in characteristics and reliability. Since the gate electrode of the p-type MIS transistor is formed by filling the WSiAs film-removed area with the W film, a damage to the gate insulating film can be decreased even in the p-type MIS transistor.

Third Embodiment

FIGS. 3A to 3I are cross-sectional views showing a model of the manufacturing method of a semiconductor device according to a third embodiment of the present invention. This embodiment relates to a semiconductor device having a memory area and a logic area.

Figure 3A:
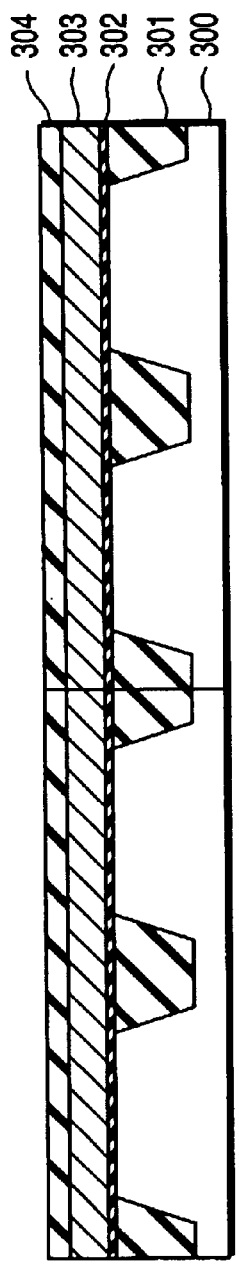
FIGS. 3A to 3I are cross-sectional views showing a model of a manufacturing method of a semiconductor device according to a third embodiment of the present invention.
Figure 3B:
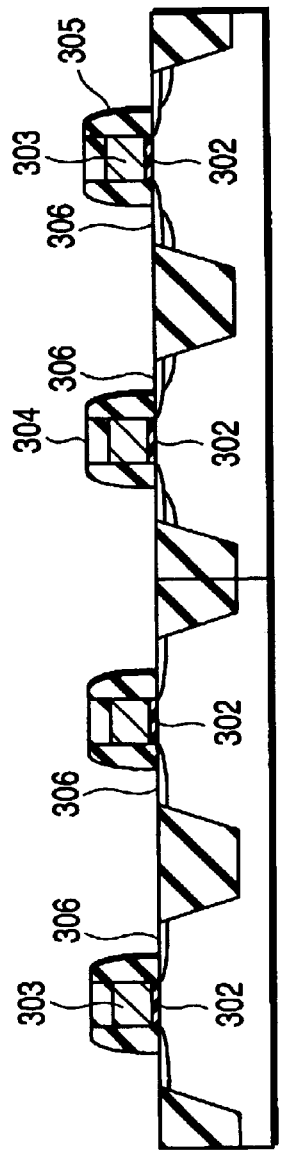

First, as shown in FIG. 3A, a silicon oxide film is formed as a gate insulating film 302 of an nMOS transistor on a single crystal silicon substrate (semiconductor substrate) 300 having isolation regions 301. Then an arsenic (As) containing tungsten silicide film (WSiAs film) 303 is deposited as a first conductive film on the silicon oxide film 302 by a CVD method. As the source gas use is made of, for example, $W(CO)_6$, $SiH_4$ and $AsH_3$. Further a silicon nitride film 304 is deposited by the CVD method on the WSiAs film 303.

Then, as shown in FIG. 38, the WSiAs film 303 and silicon nitride film 304 are anisotropically etched to provide a gate electrode. Further, after the deposition of a silicon nitride film 305, the etch-back process of the silicon nitride film 305 is done to provide a gate electrode structure surrounded with the silicon nitride films 304 and 305. It is to be noted that, by this process though being omitted in its explanation, diffusion layers 306 serving as source/drain regions are formed in a memory area and a logic area.

Figure 3C:
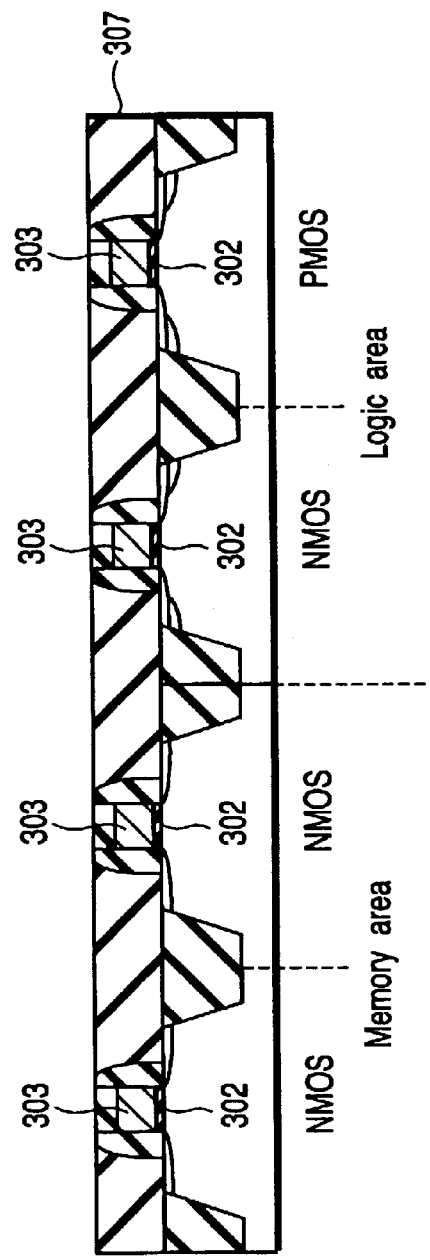

Then, as shown in FIG. 3C, an interlayer insulating film 307 is deposited on a whole surface. After this, the interlayer insulating film 307 is planarized by the chemical mechanical polishing (CMP) to expose the surface of the silicon nitride film 304.

Figure 3D:
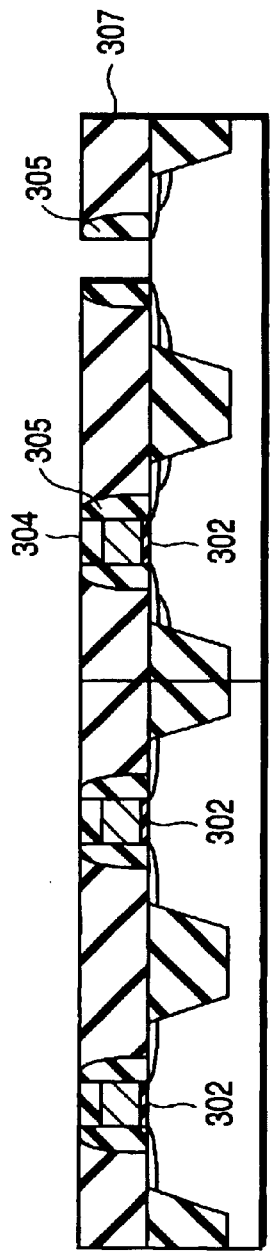

Then, as shown in FIG. 3D, the silicon nitride film 304 and WSiAs film 303 of the pMOS area in the logic area are removed and, further, the silicon oxide film 302 is also removed to provide a groove surrounded with the silicon substrate 300 and silicon nitride film 305.

Figure 3E:
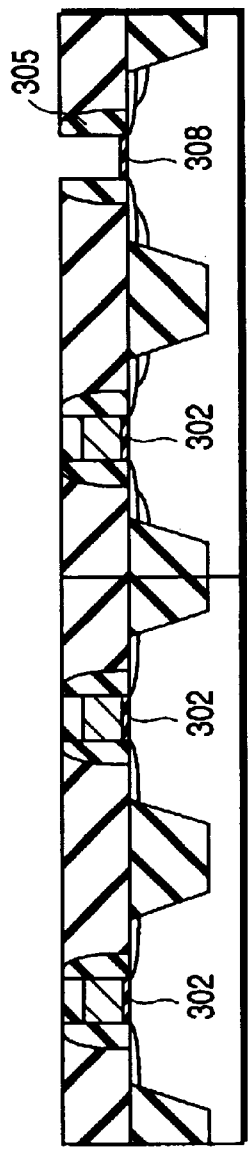

Then, as shown in FIG. 3E, a thin silicon oxide film is formed as a gate insulating film 308 of the pMOS transistor on the bottom of the groove by the plasma oxynitriding method.

Figure 3F:
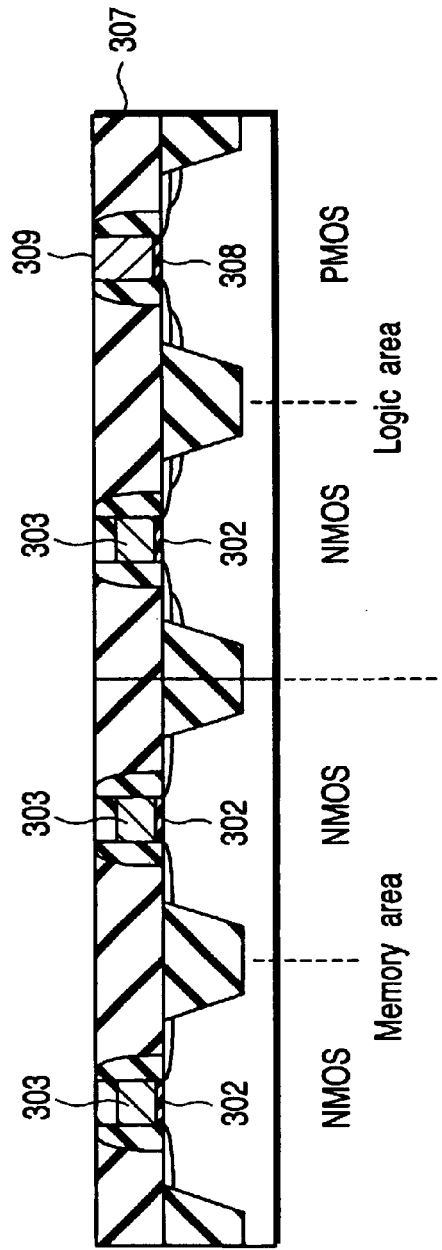

Then, as shown in FIG. 3F, a W film 309 is deposited on a whole surface. Further, the W film 309 is planarized by the CMP method to expose the surface of the interlayer insulating film 307. By doing so, a CMOS transistor can be obtained in which the WSiAs film 303 of a lower work function is used for the gate electrode of the nMOS transistor and the W film 309 of a higher work function than the WSiAs film is used for the gate electrode of the pMOS transistor.

Figure 3G:
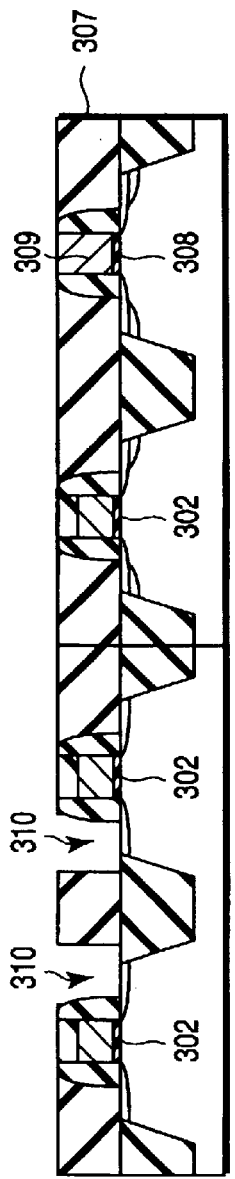

Then, as shown in FIG. 3G, contact holes 310 are formed in the interlayer insulating film (silicon oxide film) 307 in the memory area. At this time, a dry etching process is carried out at a high selection ratio of the silicon oxide film to the silicon nitride film. Even if, by this process, a contact hole pattern is shifted toward the gate electrode-direction at the lithography step, the silicon nitride film 305 formed on the sidewall of the gate electrode is left without being etched. For this reason, there occurs no electrical short-circuiting between the gate electrode and a conductive material filling the contact hole.

Figure 3H:
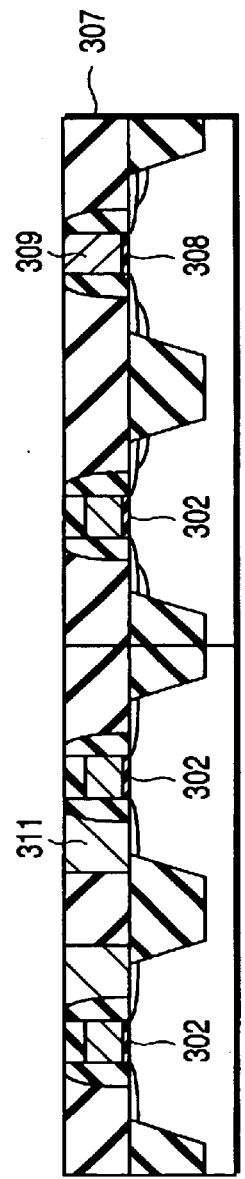

Then, as shown in FIG. 3H, a P containing silicon film 311 is deposited on a whole surface and, by the CMP method, the silicon film 311 is selectively left in the contact holes 310.

Figure 3I:
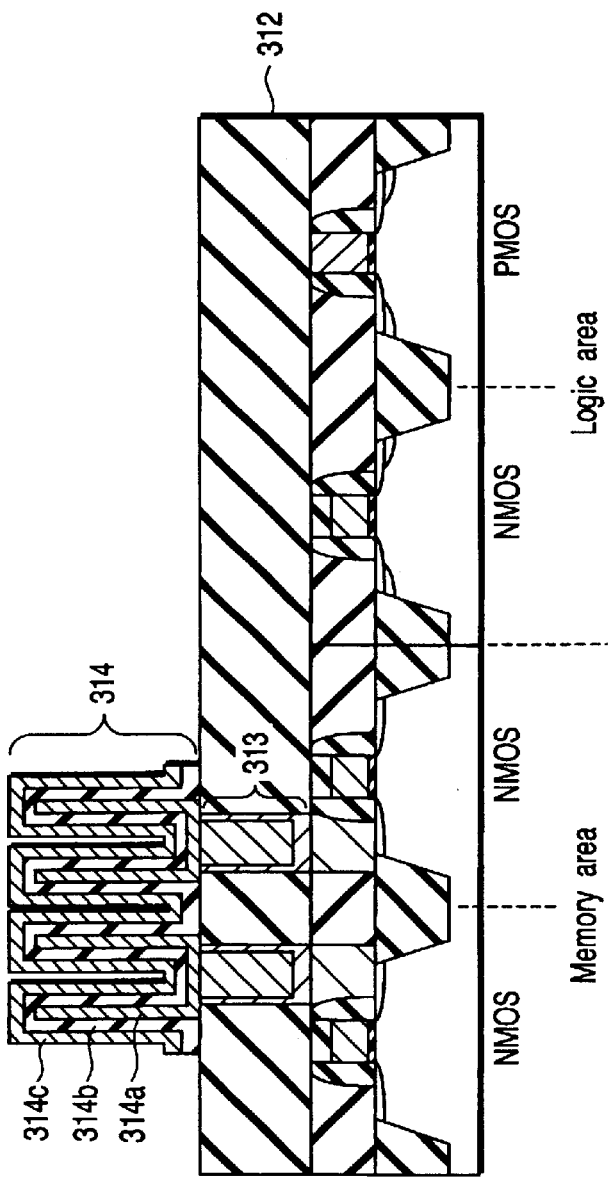

Then, as shown in FIG. 3I, an interlayer insulating film 312 is formed on a whole surface. Then a contact hole is formed in the interlayer insulating film 312 on the silicon film 311 and a contact plug 313 is formed in the contact hole. The contact plug 313 is formed of, for example, a stacked W film/TiN film/Ti film and is obtained by forming the stacked film on a whole surface and performing a planarizing step by the CMP method. Further, an MIM capacitor 314 is formed on the interlayer insulating film 312 in which the contact plug 313 is formed. The MIM capacitor 314 is comprised of a structure using, for example, a Ru film as an upper electrode 314a and lower electrode 314c and a high dielectric constant film such as a tantalum oxide film as a dielectric film 314b.

According to the present embodiment, as will be set out below, the silicon oxide film 302 in the pMOS area is removed at the step of FIG. 3D and the gate insulating film 308 is newly formed at the step of FIG. 3E. Therefore, for a pMOS transistor in the logic area, use can be made of a gate insulating film different from that of the nMOS transistor in the memory area. In the logic area, for example, use can be made of a gate insulating film thinner in thickness and higher in dielectric constant than a gate insulating film in the memory area. It is, therefore, possible to achieve a high-speed logic circuit. Further, for an nMOS transistor in the logic area, use can be made of a gate insulating film different from that of an MOS transistor in the memory area. By doing so, it is possible to further increase a speed of the logic circuit.

In the present embodiment, the gate electrode of the nMOS transistor is surrounded with the silicon nitride film and, therefore, a self-aligning contact process can be utilized for the memory area and an improved integration density can be achieved for the memory area.

Although in the above-mentioned first to third embodiments the P containing W silicide film (WSiP film) or the As containing W silicide film (WSiAs film) is used as the gate electrode of the NMOS transistor, the same effect can be obtained even by using a P containing Mo silicide film (MoSiP film) or an As containing Mo silicide film (MoSiAs film).

Although in the above-mentioned first to third embodiments use is made, as a gate insulating film, of the silicon oxide film or the silicon oxynitride film, use can also be made of a Hf oxide film, Zr oxide film, Ti oxide film, Ta oxide film, La oxide film, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device having an n-type MIS transistor and a p-type MIS transistor, comprising:

forming a first gate insulating film in a first area where the n-type MIS transistor is to be formed;

depositing a first conductive film on the first gate insulating film in the first area, the first conductive film containing silicon, a metal element selected from tungsten and molybdenum and an impurity element selected from phosphorus and arsenic;

forming a second gate insulating film in a second area where the p-type MIS transistor is to be formed; and forming a second conductive film on the second gate insulating film in the second area, the second conductive film having a work function higher than that of the first conductive film.

2. The method according to claim 1, wherein depositing the first conductive film in the first area includes depositing the first conductive film in the second area.

3. The method according to claim 2, wherein forming the second conductive film in the second area includes forming a metal film on the first conductive film deposited in the second area and allowing the first conductive film to react with the metal film by a heat treatment to lower a concentration of silicon in the first conductive film.

4. The method according to claim 3, wherein the metal film contains at least one of Pt, Pd, Ni, Co, W, Mo, Sb and Bi.

5. The method according to claim 2, wherein forming the second conductive film in the second are includes removing the first conductive film deposited in the second area and filling that region where the first conductive film is removed with the second conductive film.

6. The method according to claim 5, wherein the second conductive film is a metal film.

7. The method according to claim 1, wherein the first conductive film is deposited by a chemical vapor deposition method using a source of silicon, a source of the metal element and a source of the impurity element.

8. The method according to claim 1, wherein the n-type MIS transistor is used for a memory circuit and the p-type MIS transistor is used for a logic circuit.

9. The method according to claim 1, wherein the second gate insulating film is different from the first gate insulating film in terms of at least one of their thickness and dielectric constant.

10. The method according to claim 1, wherein a concentration of the impurity element in the first conductive film is higher than $1 \times 10^{20}/cm^3$.

11. The method according to claim 1, wherein a concentration of the impurity element in the first conductive film is higher than $1 \times 10^{21}/cm^3$.

* * * * *

UNITED STATES PATENT AND TRADEMARK OFFICE
CERTIFICATE OF CORRECTION

PATENT NO. : 6,727,129 B1
DATED : April 27, 2004
INVENTOR(S) : Nakajima

It is certified that error appears in the above-identified patent and that said Letters Patent is hereby corrected as shown below:

Column 8,
Line 40, change "second are" to -- second area --.

Signed and Sealed this

First Day of February, 2005

JON W. DUDAS
*Director of the United States Patent and Trademark Office*